United States Patent [19]

Sleger et al.

[11] Patent Number: 4,566,594
[45] Date of Patent: Jan. 28, 1986

[54] COMPONENT VERIFIER

[75] Inventors: Leon F. Sleger, Wakefield; Robert D. DiNozzi, Beverly, both of Mass.

[73] Assignee: USM Corporation, Farmington, Conn.

[21] Appl. No.: 689,507

[22] Filed: Jan. 8, 1985

Related U.S. Application Data

[63] Continuation of Ser. No. 451,917, Dec. 27, 1982, abandoned.

[51] Int. Cl.4 .............................................. B07C 5/02
[52] U.S. Cl. .................................. 209/539; 209/573; 209/657; 209/906; 324/158 F; 414/217
[58] Field of Search ............. 209/524, 525, 539, 571, 209/573, 656, 657, 906; 198/502; 414/217; 406/83; 324/158 F, 73 AT

[56] References Cited

U.S. PATENT DOCUMENTS

| | | | |
|---|---|---|---|
| 2,858,018 | 10/1958 | Alexander et al. | 209/573 X |
| 3,716,786 | 2/1973 | Gearin | 209/573 X |
| 3,727,757 | 4/1973 | Boisskat | 209/573 |
| 3,937,386 | 2/1976 | Hartleroad et al. | 228/180 |
| 4,058,223 | 11/1977 | Cruse | 406/83 X |
| 4,293,249 | 10/1981 | Whelan | 414/217 X |
| 4,410,227 | 10/1983 | Prunella et al. | 209/573 X |

FOREIGN PATENT DOCUMENTS 0004265 12/1978 European Pat. Off. ............ 198/502

*Primary Examiner*—Robert B. Reeves
*Assistant Examiner*—Glenn B. Foster
*Attorney, Agent, or Firm*—Alan N. McCartney

[57] ABSTRACT

A verifier for a chip type component placement mechanisms which has an air track conveying the component from a supply source to a placement head. The verifier is positioned in the air track and stops the chip for testing to determine whether the proper chip is presented and whether the chip is the proper electrical value. If the chip is acceptable, it is sent on down the track to the placement head, and if unacceptable, it is rejected from the system.

11 Claims, 6 Drawing Figures

COMPONENT VERIFIER

This application is a continuation of application Ser. No. 451,917, filed Dec. 27, 1982—now abandoned.

BACKGROUND OF THE INVENTION

In the U.S. patent application Ser. No. 299,979 filed Sept. 8, 1981 (assigned to the assignee of the invention disclosed herein) there is disclosed an invention for a machine for placing chip type electronic components on a printed circuit board at a very high rate of speed. This chip assembly system is a high speed random component supply system that utilizes an air conveyor to transport chips, one at a time, from their respective input stations to a placement head that places them onto a printed circuit board.

In this type of chip placement assembly apparatus, a small dot of adhesive is placed on the circuit board between the conductive lands of the board. The placement head positions the component on the adhesive to secure the component between the conductive lands of the boards prior to the wave soldering of the boards. U.S. patent application Ser. No. 441,261 filed Nov. 15, 1982 (assigned to the assignee of the invention disclosed herein) is directed to such an adhesive dispensing mechanism.

In the above-described sequence of operation, errors occurring such as placement of the wrong chip or an electrically defective chip are costly to repair once the printed circuit board is completed. Because chips are difficult to repair once they are soldered to the board and since chips have limited identification marking for inspection purposes, a verification that the proper chip has been selected and that the chip is electrically functional affords a tremendous cost saving in the entire assembly apparatus. Therefore, it is desirable to provide in the chip placement mechanism a means to electrically test the component before the component is placed on the board. This is most conveniently done in the line (or conveyor) which transports the chip from the supply to the placement head. Further, during the testing or verifying sequence, the component must be stopped, and the testing for acceptance or rejection of the component must be done with a minimum of delay in order to meet the speed specifications of all the other mechanisms involved in the chip placement apparatus. In fact, in order to meet the chip placement system speed requirements of 15,000 chips/hour, the chip can only remain at the verifier 60 milliseconds (about 1/16 of a second).

STATEMENT AS TO PRIOR ART

Since the component verifier or tester is located in the line transporting the component from the storage source to the placement head, the verifier or tester is designed to be compatable with the particular transport system being used. The type of transport system being used in the prior art chip placement machines is a rotary turret head having a plurality of arms supporting a placement head which picks up the component from an input source and indexes the component through various stations of the machine to a final component placement station. One of the stations through which the component is passed during indexing of the rotary transport system is a component testing station.

The chip placement apparatus in which the verifier of this invention is used has an air track type conveyor for transporting the component from the source to the placement head. Therefore, the verification requirements of the overall system in which the instant invention is utilized are different.

SUMMARY OF THE INVENTION

This invention is directed to an automatic electrical tester for discrete electronic chip type components such as capacitors, resistors, jumpers or diodes. The components are fed by air through a track to a verifier where they are tested for acceptability.

The verifier comprises a component stop mechanism, a component positioning mechanism for properly positioning the component in the air track for testing and a pair of electrical probes positioned to contact the leads on the opposed ends of the component to verify that the component is the proper one selected for placement on the board and to test whether the component is electrically acceptable. If the component is acceptable, an air jet sends the component out of the test station on down the track to the placement head. If the component is unacceptable, a track switch is energized to expel the component from the track into a receptacle. All of the above apparatus are computer controlled so that each operates in proper sequence during the function of the chip placement apparatus.

DESCRIPTION OF THE PREFERRED EMBODIMENT

Figure 1:
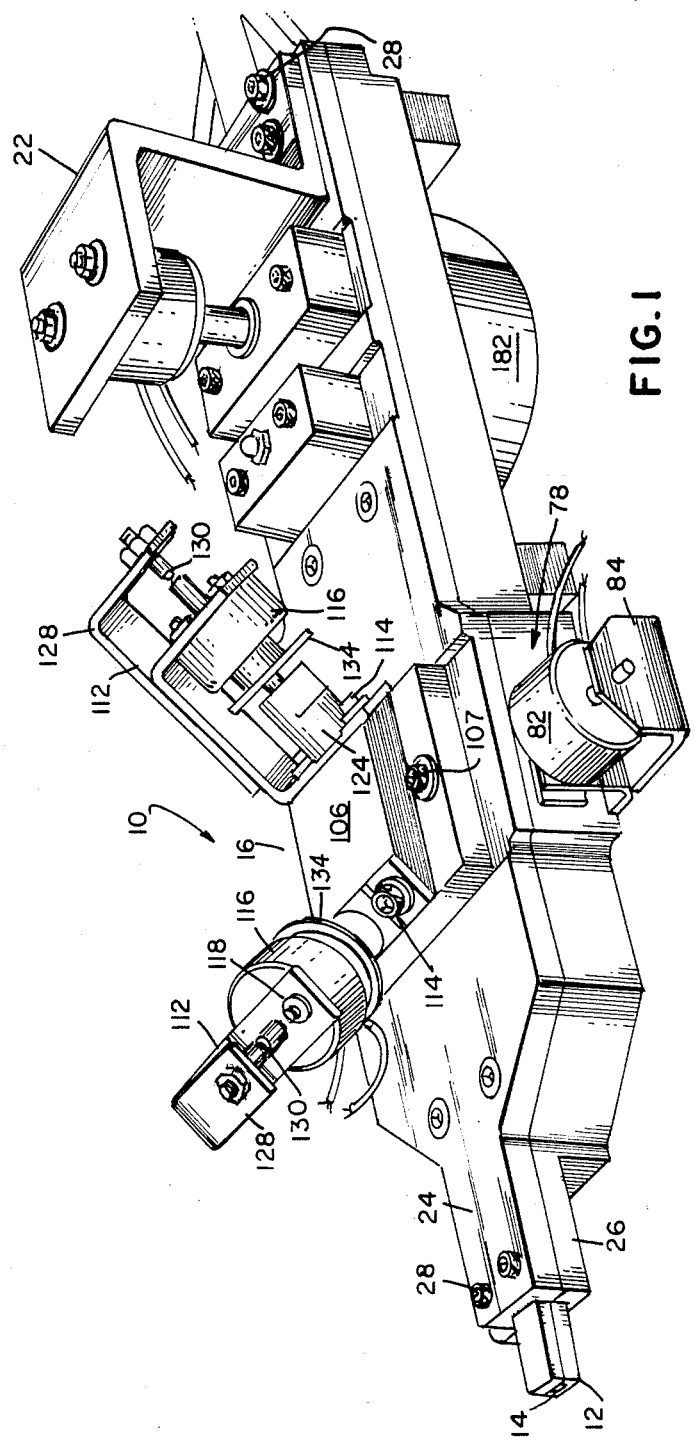
FIG. 1 is a perspective view of the verifier of this invention mounted on the air track.

Attention is now directed to FIG. 1 which illustrates the verifier 10 mounted in the air track 12 of a chip placement machine. The device is primarily intended as an on-line tester for a chip placement machine of the type illustrated in copending U.S. patent application Ser. No. 229,979 filed Sept. 8, 1981 and would be positioned in that machine as illustrated in the aforementioned copending application. However, as will become apparent hereinafter, in addition to the application disclosed herein, the verifier of this invention could be used for other test oriented functions, such as bulk sorting of components into value categories or for general parts inspection for acceptability.

The air track 12 has a slot or passageway 14 through which the chip passes to a test station 16 at which the chip is stopped at 18 (see also FIG. 2) and tested by probes 20 for electrical value and then passed on down the track to the placement head or rejected at the track switch station 22.

The air track 12 has an upper and lower housing 24, 26 respectively, secured together by any convenient means such as threaded fasteners 28. The track housing 26 has a groove 30 forming the passageway 14 for the transport of the chips "C". A seal means 34 comprising elastomeric material is contained in grooves 32 between the track sections to contain the air in the track passageway 14 (See FIG. 5).

At the test station 16, a spring biased stop mechanism 18 is positioned in the passageway 14 to stop the chip for testing. This testing of the component will verify that the proper chip is present and that the electrical value of the chip is acceptable. The stop mechanism 18 comprises a solenoid 36 having its housing 38 secured to the lower track housing 26 by a bracket 40 fastened to the housing 26 by securing means 42. Also, attached to bracket 40 is a bracket 44 carrying a spring biased pin 46 that biases the solenoid pin 48 upwardly. Attached to the solenoid pin 48 through coupling 50 is the chip stop 52 positioned in the passageway 14. The chip stop 52 passes through an insert 54 located in the lower track housing and has a surrounding air seal 56.

The chip stop 52 is normally located in passageway 14 through the upward bias of the solenoid pin 48 by the spring pin 46 fixed to bracket 40 by a hex nut 58. As the chip travels down the passageway 14, it comes to rest against the flat face 60 of the chip stop 52. After the component has been tested at the test station, the solenoid 36 is energized withdrawing the chip stop 52 downwardly out of passageway 14.

To maintain the face 60 in alignment in passageway 14, an anti rotating mechanism 62 is associated with the solenoid pin 48. A bracket 64 secured to the lower track housing 26 by fastener 66 has an arm 68 against which a stop 70 rides. The stop 70 is secured to the solenoid pin 48 by a flange 72. In this manner, as the solenoid pin rides up and down, the pin is prevented from rotating to maintain the chip stop 52 in proper position in the passageway 14. Additionally, the chip stop 52 has a groove 74 permitting free passage of air down the passageway 14 when the chip stop is in the upward position.

Also carried in the passageway 14 at the test station 16 is an indicator in the form of a light emitter 76 shining across the track and a receiver senser window on the opposite side of the track. The chips arrival blocks the light from entering the receiving window in sufficient portion to be measured electrically. This tells the computer control of the machine that the chip is in place against stop 52 for testing.

Figure 4:
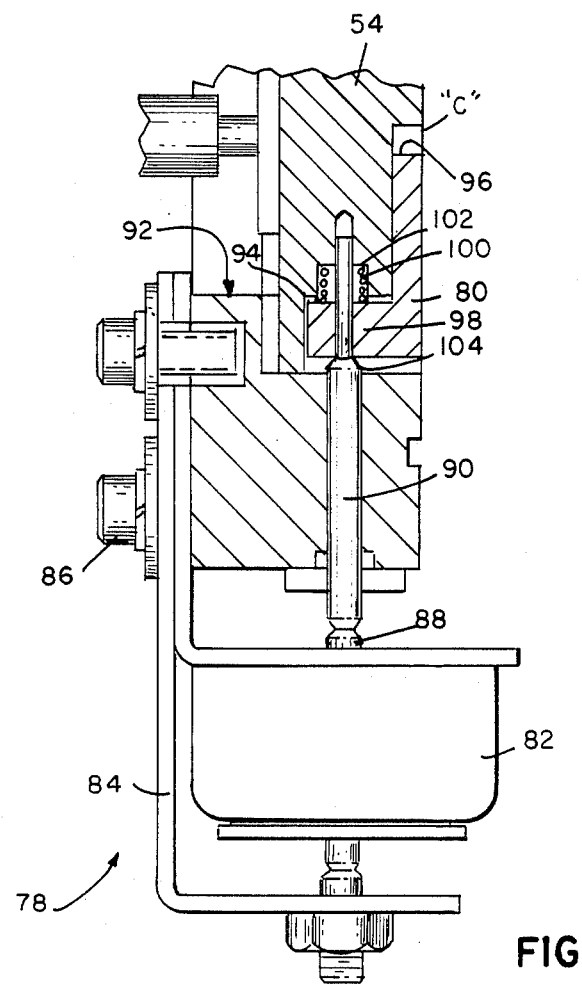
FIG. 4 is a side elevational view of the component locating mechanism that positions the component in the air track prior to testing.
Figure 5:
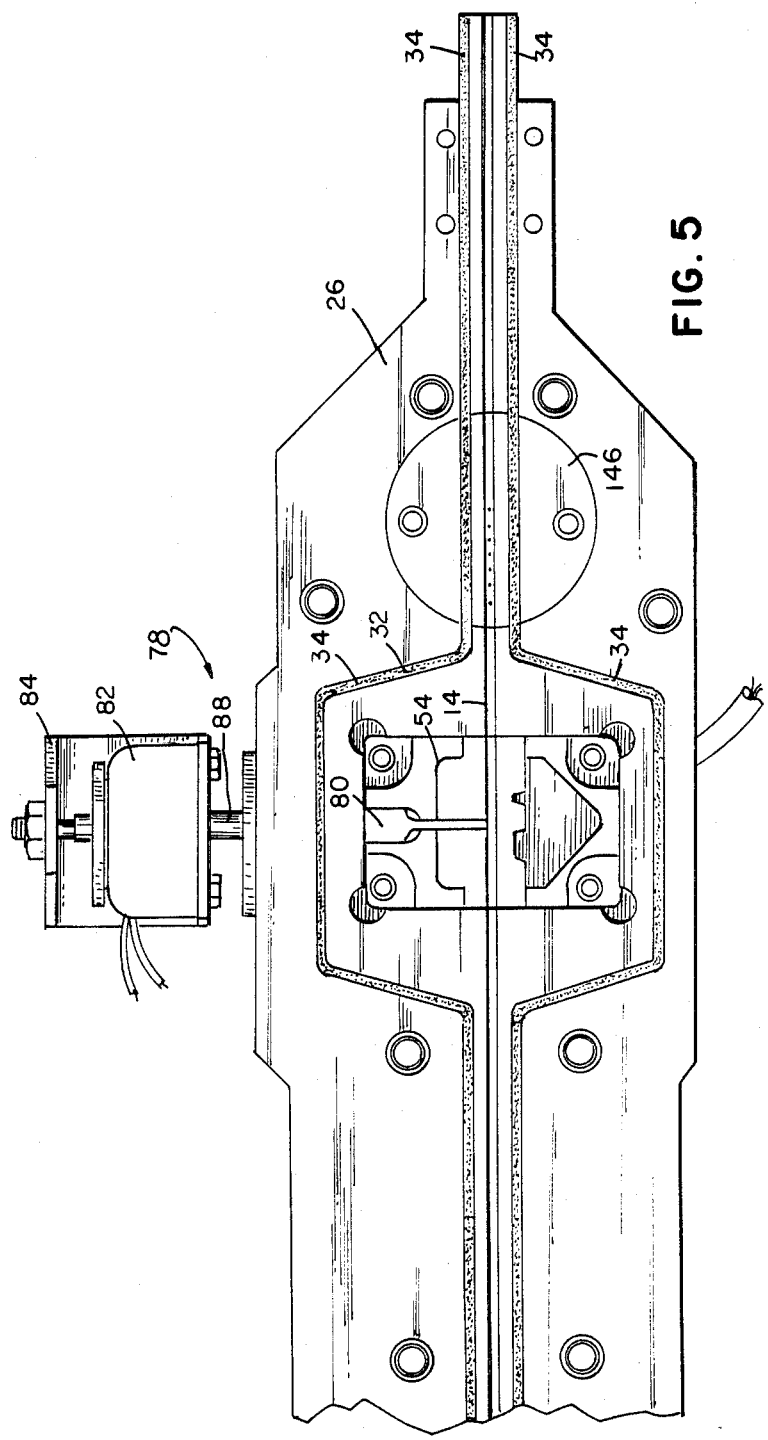
FIG. 5 is a plan view of the positioning mechanism illustrated in FIG. 4 being shown mounted in the air track with the track cover removed.

Attention is now directed to FIGS. 1, 4 and 5 which illustrate the means 78 to position the chip in the track for testing after the chip has come to rest against chip stop 52. Since the chip is slightly smaller in cross section than passageway 14, it may be necessary to position one side edge of the chip against the passageway wall to square up the chip for testing. This is accomplished by means of a ram 80 actuated by a solenoid 82. The solenoid 82 is carried on brackets 84 secured to the lower track housing 26 at 86. The solenoid pin 88 acts against a pin 90 carried in portion 92 of the lower track housing. The ram 80 is slidably disposed in recess 94 in insert 54 for movement of the ram face 96 into and out of the passageway 14. A leg 98 on ram 80 is positioned in recess 94 and has an opening for receiving the reduced end portion of pin 90. A spring 100 positioned in recess 102 in insert 54 acts against leg 98 to normally bias the ram out of passageway 14. After the chip is stopped, the solenoid 82 is energized causing the pin 90 (through its shoulder contact 104 with leg 98) to move outwardly against the bias of spring 100 to move ram face 96 into passageway 14 against the chip "C" to square the chip up in the track for testing.

Figure 2:
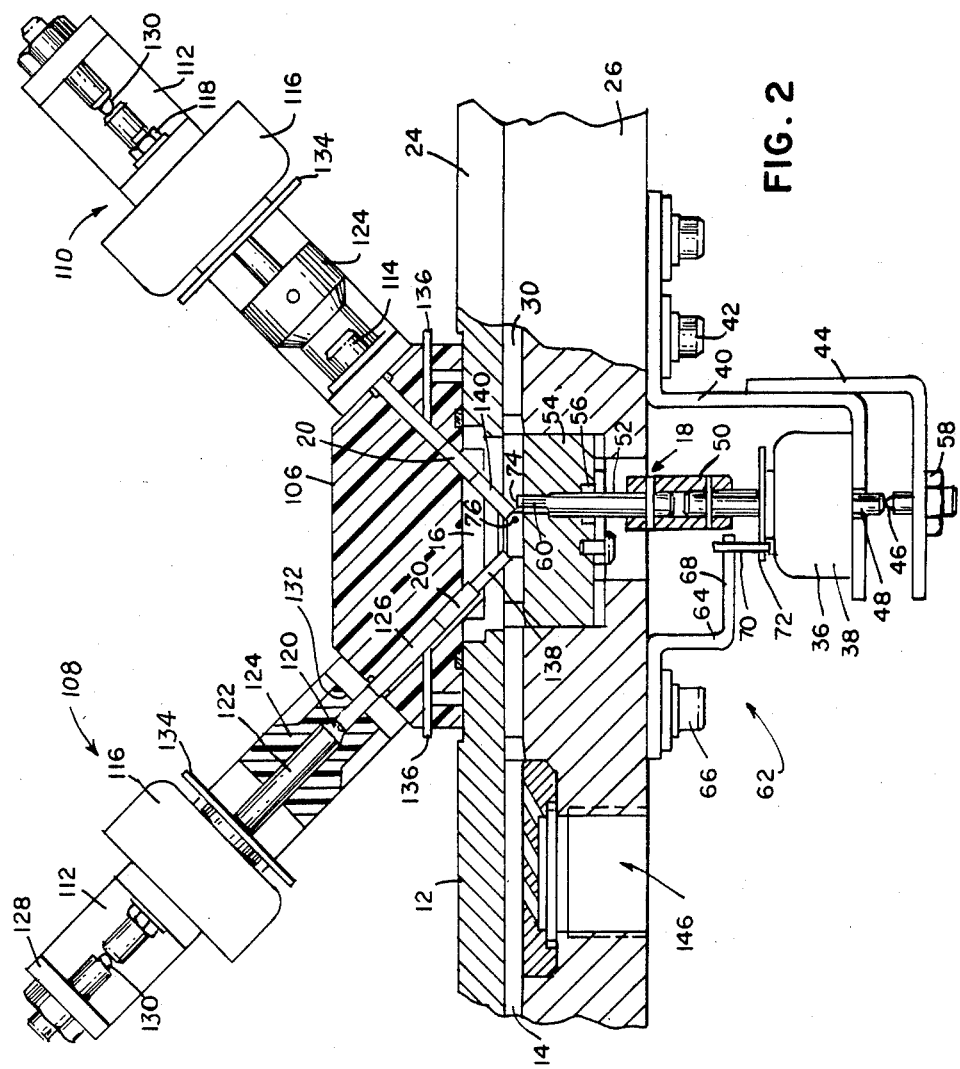
FIG. 2 is a side elevational view partially in section of the component test station.

FIGS. 1 and 2 illustrate the details of the test station 16 which comprises a cover member 106 secured at 107 to the upper track housing 24 above insert 54. A pair of opposed test probe actuators 108, 110 are angularly disposed on the cover member 106 (these actuators are identical in construction and therefore only one is explained in detail). A bracket 112 is secured at 114 to the cover member 106 and carries a solenoid 116 by securing means 118. The downward end 120 of the solenoid pin 122 is carried in a coupling 124. The test probe 20 is also secured to coupling 124 and pass down through opening 126 in the cover member 106. The upper leg 128 of each bracket 112 carries a spring biased pin 130 which biases the solenoid pin 122 and probe 20 downward into the passageway 14. Actuation of the solenoids raise the probes 20 out of the passageway 14 against the bias of pins 130. The shoulders 132 on couplings 124 act as stops against brackets 112 limiting downward movement of the probes 20. Each plate 134 on solenoid pin 122 acts against the solenoid 116 to limit upward movement of the probes from the passageway 14. Electrical connectors 136 pass through the cover 106 and are in frictional engagement with probes 20 for electrical connection of the probes to the computer control of the tester.

With the arrangement thus described, the probes 20 are normally biased by pins 130 into the passageway 14. As the chip travels into the verifier, the solenoids 116 are energized to retract the probes from the passageway 14. Thereafter, the chip stop arrests the chip and the ram squares up the chip in the passageway as previously described. The solenoids 116 are then deenergized and the spring pins place the probes into the passageway 14. At this point, the probes 20 contact the upper corners of chip "C". A particular angular deposition of the probe actuator is selected so that the probes will contact the upper corners of the chip where the component electrodes are always located. The angle of the probes is important because of the dimensional variations in the length and height of the various chip components that are to be tested. The front electrode 138 of probe 20 must accommodate a wide range of chip heights without impacting the plastic passageway floor which would insulate the probe-chip contact. Additionally the angle of contact of the rear electrode 140 is also critical since it must contact chips varying in both height and length without being insulated against the passageway. It should also be noted that the computer control for the test station can also be programmed to retract and reactuate the contact probes for a second test in event the first test fails due to poor contact with the chip.

After the chip has been tested and verified, the chip stop and ram are removed from the passageway and the probes raised. At this time, a blast of air is emitted at insert 146 in lower track 26 to send the chip down the passageway 14 to the placement head. As the chip passes down the track, it passes light emitter 148 and light receiver (see FIG. 3) 150 to indicate to the control that the chip is out of the test station. The light emitter 148 opposes a light receiver 150 such that as the chip passes this "chip out" indicator, the light will not be received through the track. This lack of light is measured through a light sensitive electronic device such as a phototransistor electrically connected to the machine computer control. At this point, the solenoid 36 is deenergized to close the chip stop 18 so that the verifier can receive another chip.

Figure 3:
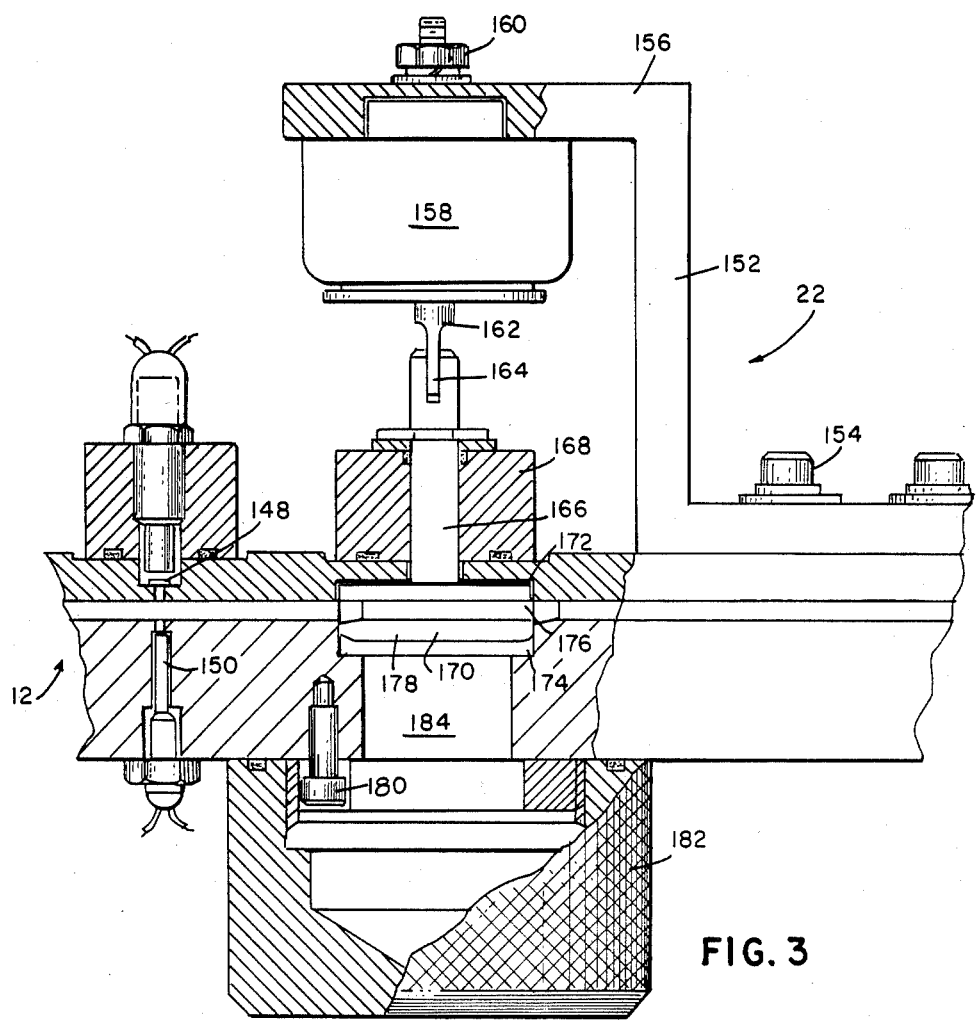
FIG. 3 is a side elevational view partially in section of the track switch which removes an unacceptable component from the air track.
Figure 6:
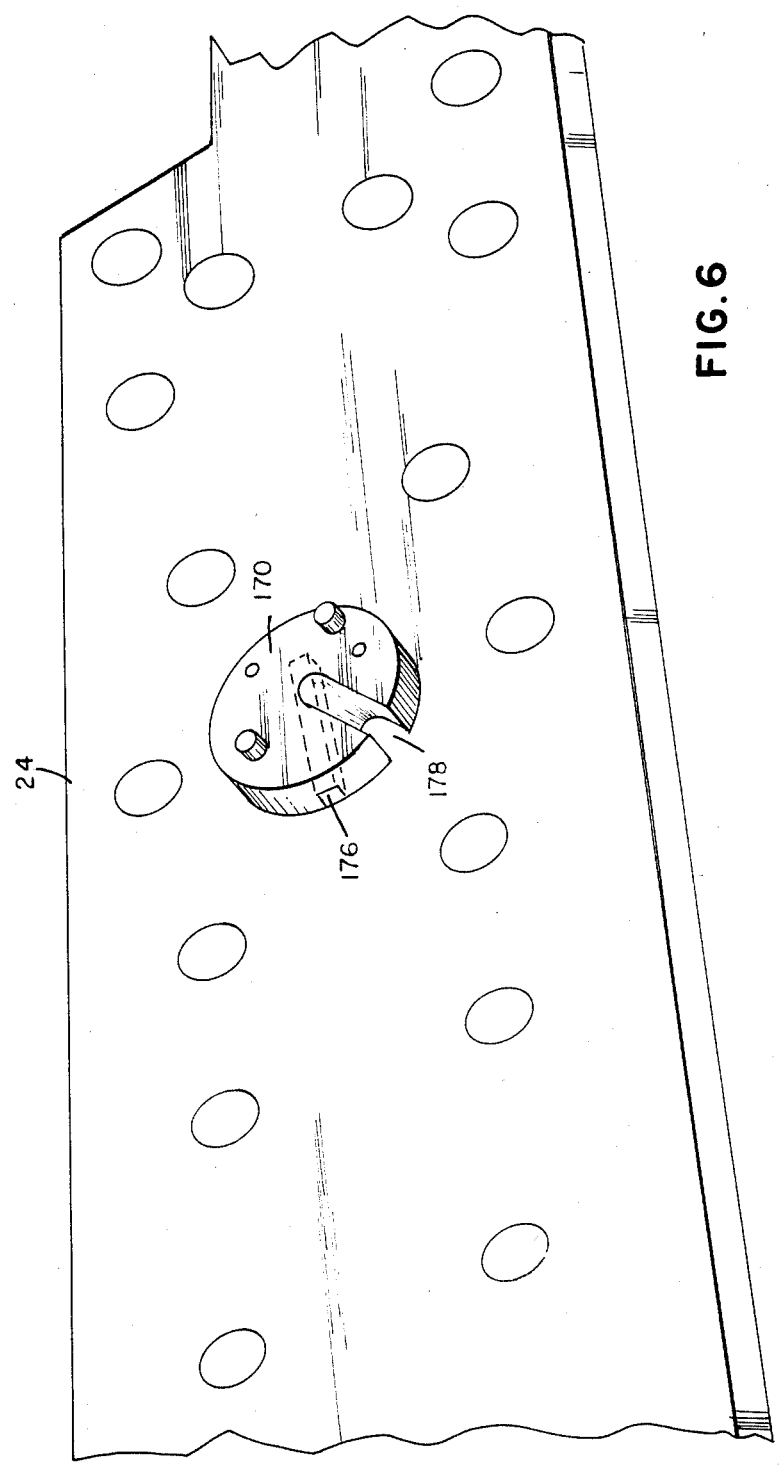
FIG. 6 is a perspective view of the air track cover illustrating the bottom of the track switch.

If the component test indicates an unacceptable chip, the switch station 22 is activated at the time the chip leaves the test station and rejects the chip from the system (See FIGS. 3 and 6). A bracket 152 is secured at 154 to the upper track housing 24. The arm 156 of the bracket 154 carries a rotary solenoid 158 by securing means 160. The solenoid pin 162 has a tongue and groove connection 164 to a rotary switch 166 mounted in block 168 carried on the upper track housing 24. The rotary switch 166 has a disc member 170 received in recesses 172, 174 in the upper and lower track housing. The disc valve 170 has a pass through slot 176 and an inclined rejection slot 178. Mounted on the lower track housing 26 at 180 is a receptacle 182 which is in communication through opening 184 with the disc valve 170.

If a given chip is tested unacceptable by the verifier, this information is communicated to the computer control causing solenoid 158 to be energized, rotating disc valve 170 to align reject slot 178 with passageway 14 to reject the chip down into receptacle 182. In this manner the unacceptable component is removed from the system. If however, the chip is electrically acceptable, the solenoid 158 will not be energized and the chip will pass through slot 176 down the track to the placement head of the machine.

It can thus be seen that the verifier of this invention is located in an air track conveyor and stops and positions the component to be tested and after completion of the test either permits the component to continue down the conveyor or be rejected from the system if unacceptable.

Further, it should be noted that in certain applications the component will have the electrical terminals facing downward for application to the board. In this case, the verifier probes could be located in reverse, on the lower track housing and extend upwardly into the passageway 14. In the event that testing is required of components that are intermixed, that is with the terminals facing both upwardly and downwardly, then the verifier could be manifolded to conduct a series of tests with the probes located both in the upper and lower track housing as described above. That is a first verifier could be positioned on the track as illustrated in FIG. 2 to test components with terminals which extend upwardly. Further down the track could be another verifier which has probes extending upwardly to test components with probes on the lower edges on the bottom of the component. In this instance, failure of a first test would cause a test to occur in the next stage so that both types of components could be tested.

We claim:

1. A verifier operable in response to a computer control for testing the acceptability of a chip type component passing down an enclosed air track conveyor having a passageway in which the component is transported, comprising:
   (a.) means positioned exterior of the conveyor and insertable into the passageway for arresting the travel of the component in the conveyor;
   (b.) means mounted exterior of the conveyor and including means extending into the conveyor passageway for electrically contacting the electrical contacts on the component to test whether the proper component is present and whether the electrical value is acceptable;
   (c.) means for releasing said arresting means and said electrical contacting means to permit the component to pass down the conveyor; and
   (d.) means downstream from the verifier including a rotary switch having a slot in communication with the conveyor passageway when a component tests acceptable and an inclined rejection slot in communication with the conveyor passageway for rejecting the component if it is unacceptable.

2. The verifier set forth in claim 1 wherein said arresting means is a spring biased stop positioned in the conveyor passageway and activated by a solenoid to be removed from the passageway after completion of the testing.

3. The verifier set forth in claim 1 wherein said electrical contact means is a pair of angularly disposed electrical probes spring biased into the passageway and adapted to contact the electrical contacts on the component.

4. The verifier of claim 3 wherein said electrical probes are activated by solenoids for removal from the passageway at the completion of the testing.

5. The verifier set forth in claim 1 wherein a light emitter and receiver is located adjacent the arresting means which when blocked will indicate to a computer control that the component is in position for testing.

6. The verifier set forth in claim 1 wherein a component positioning means is located adjacent said arresting means to properly position the component in the conveyor for testing.

7. The verifier set forth in claim 1 wherein an additional air jet is supplied to the conveyor after the component is tested to facilitate moving the component down the track.

8. The verifier set forth in claim 1 wherein a light emitter and receiver are located in the track downstream of the electrical testing means which when blocked by the presence of the component will indicate to a computer control that the component is passing further down the track.

9. A verifier for testing the acceptability of a chip type component that is selected from a component source and passed down an enclosed air track conveyor having a passageway in which the component is transported, comprising:
   (a.) an upper and lower housing secured together in the conveyor to form a test station;
   (b.) a component stop located at said test station having means insertable into the conveyor passageway to arrest the travel of the component in the air track for test purposes;
   (c.) means positioned in the air track to indicate the component is in place against said component stop;
   (d.) electrical probes passing into said conveyor passageway and adapted to be positioned against the contacts on the component for testing; and
   (e.) means including a rotary switch having a slot in communication with the conveyor passageway when a component tests acceptable and an inclined rejection slot in communication with the conveyor passageway for removing the component from the air track if the component tested unacceptable.

10. The verifier set forth in claim 9 including means to position the component in the air track for testing and means supplying an additional air supply to the track after component testing is complete to send the component down the track.

11. The verifier of claim 10 wherein the removing means comprises a solenoid operated track switch energized upon an indication of an unacceptable component to remove the component from the track.

* * * * *